United States Patent [19]
Reif et al.

[11] Patent Number: 5,724,004
[45] Date of Patent: Mar. 3, 1998

[54] VOLTAGE BIAS AND TEMPERATURE COMPENSATION CIRCUIT FOR RADIO FREQUENCY POWER AMPLIFIER

[75] Inventors: Warren P. Reif, Fort Worth, Tex.; William Beckwith, Chandler, Ariz.

[73] Assignee: Motorola, Inc., Schaumburg, Ill.

[21] Appl. No.: 662,551

[22] Filed: Jun. 13, 1996

[51] Int. Cl.[6] ........................................ H03F 3/16
[52] U.S. Cl. ............................ 330/277; 330/289; 330/296
[58] Field of Search ................................ 327/537, 541, 327/543; 330/277, 285, 289, 296

[56] References Cited

U.S. PATENT DOCUMENTS 5,373,250  12/1994  Gatti et al. ............................ 330/277
5,408,697   4/1995  Price et al. ........................... 330/289 X
5,506,544   4/1996  Staudinger et al. ................... 330/289 X Primary Examiner—Steven Mottola
Attorney, Agent, or Firm—John G. Rauch

[57] ABSTRACT

A communication device (104) includes a radio frequency power amplifier (202) and a bias circuit (204). The power amplifier (202) includes a depletion mode MESFET (214) for RF power amplification. To properly bias the MESFET (214) in a circuit including logic components powered by a conventional battery (136), the bias circuit (204) includes a level shifter (223) to provide the necessary gate-to-source voltage for the MESFET (214). To maintain the RF output power from the communication device (104) constant over temperature, the bias circuit (204) output voltage varies over temperature to track the temperature variation of the MESFET (214).

7 Claims, 1 Drawing Sheet

5,724,004

VOLTAGE BIAS AND TEMPERATURE COMPENSATION CIRCUIT FOR RADIO FREQUENCY POWER AMPLIFIER

FIELD OF THE INVENTION

The present invention relates generally to communication devices. The present invention relates more particularly to a power amplifier circuit for a radio frequency communication device.

BACKGROUND OF THE INVENTION

Power amplifier circuits are used for amplifying radio frequency (RF) signals for transmission by a communication device. The power amplifier circuit receives a RF signal in the transmit path of the communication device, amplifies the RF signal and provides the amplified signal to an antenna.

To meet system requirements, the RF antenna power output must be maintained substantially constant. For example, portable cellular telephones specify 600 mW RF power output at the antenna.

Some power amplifier designs include a gallium arsenide (GaAs) MESFET (metal epitaxial semiconductor field effect transistor) device in an amplification stage. Such devices provide good performance across a wide frequency range, including the range from 1800 to 2000 MHz. Depletion mode MESFETs, which require a gate to source voltage ($V_{gs}$) less than zero volts to turn off the transistor, are used for RF power amplification. A bias voltage is supplied to the MESFET to establish the $V_{gs}$.

The threshold or pinch off voltage ($V_{th}$) of a depletion mode MESFET has a negative temperature coefficient. That is, the threshold voltage becomes more negative with increasing temperature. When such a device is operating near pinch off, an increasingly more negative gate voltage will maintain a constant drain current as temperature increases. Constant drain current with respect to temperature results in lower RF gain of the amplification stage and lower power output, with increasing temperature. This is due to the MESFET transconductance, which has a negative temperature coefficient, and output conductance, which has a positive temperature coefficient. As a result, RF GaAs MESFET devices require a bias current which increases with increasing temperature to maintain constant gain and output power.

Conventional communication devices have used a closed loop feedback system for maintaining constant output power. In such a system, output power is detected at the antenna and a signal indicative of the output power is conveyed to a control circuit, such as a microprocessor in the communication device. The controller then adjusts the bias current as required to maintain constant output power.

Such conventional designs significantly limit the performance of the power amplifier. A directional coupler is required for detecting output power at the antenna. The directional coupler causes excess power loss at the antenna. At maximum transmit power, the power loss could be as high as 1 dB or 25 percent. In addition to this excess power loss, the conventional design adds to the parts count of the design, increasing manufacturing cost, and adds to the system complexity and the software overhead necessary for the communication device. In addition, the circuit elements employed for detecting output power and adjusting bias current are not able to develop the negative (below 0 volts) gate-to-source voltage for biasing the depletion mode MESFET.

Accordingly, there is a need for an improved power amplifier circuit, including an improved voltage bias circuit for biasing the power amplifier.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

Figure 1:
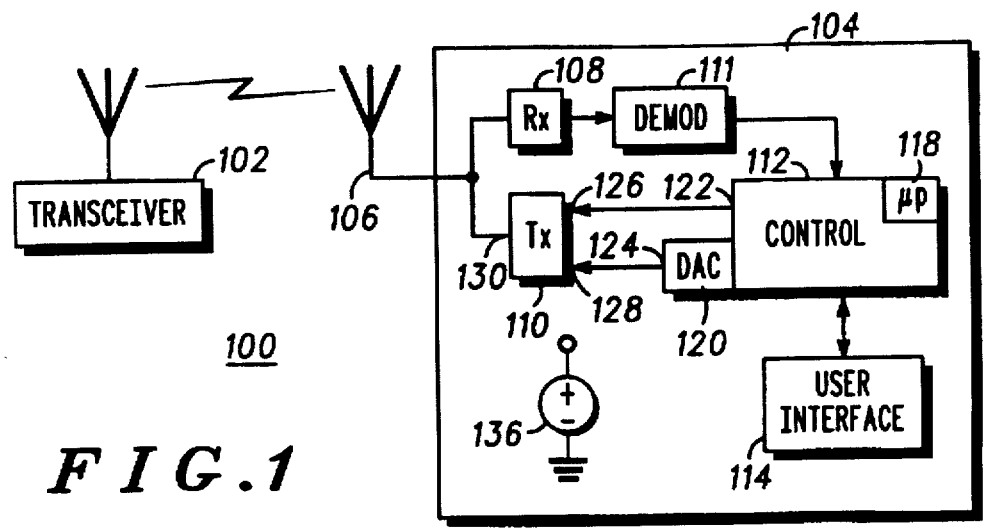
FIG. 1 is a block diagram of a communication system including a communication device.

FIG. 1 is an illustration in block diagram form of a telecommunication system or radiotelephone communication system 100. The radiotelephone communication system 100 includes a remote base station transceiver 102 and a communication device such as a radiotelephone handset 104. The remote base station transceiver 102 sends and receives radio frequency (RF) signals to and from radiotelephone handsets within a fixed geographic area. The radiotelephone handset 104 is one such radiotelephone handset contained within the geographic area. The radiotelephone handset 104 includes an antenna 106, a receiver 108, a transmitter circuit 110, a demodulator 111, a controller 112, a user interface 114 and a battery 136. The battery 136 provides electrical power for operating the radiotelephone handset 104.

Upon reception of RF signals, the radiotelephone handset 104 receives the RF signals through the antenna 106. The antenna 106 and receiver 108 convert the received RF signals into electrical baseband signals. The demodulator 111 demodulates the electrical baseband signals, recovers the data transmitted on the RF signals and provides the data to the controller 112. The controller 112 formats the data into recognizable voice or information for use by user interface 114. The user interface 114 communicates the received information or voice to a user. Typically, the user interface includes a display, a keypad, a speaker and a microphone.

Upon transmission of radio frequency signals from the radiotelephone handset 104 to the remote base station transceiver 102, the user interface 114 transmits user input data to the controller 112. The controller 112 formats the information obtained from the user interface 114 and sends it to the transmitter circuit 110 for conversion into RF modulated signals. The transmitter circuit 110 conveys the RF modulated signals to the antenna 106 for transmission to the remote base station transceiver 102.

The controller 112 includes a processor 118 and a digital to analog converter (DAC) 120. The controller 112 has an output 122 for providing baseband signals to an input 126 of the transmitter circuit 110. The DAC 120 has an output 124 for providing a control signal to a control input 128 of the transmitter circuit 110. The radiotelephone handset 104 includes other control connections coupling the controller 112 to other operational elements of the radiotelephone handset 104. However, these connections are not illustrated in FIG. 1 so an not to unduly complicate the drawing figure. Operation of the transmitter circuit 110 in response to the radio frequency signals and the control signal will be described in further detail below in conjunction with FIG. 2.

Figure 2:
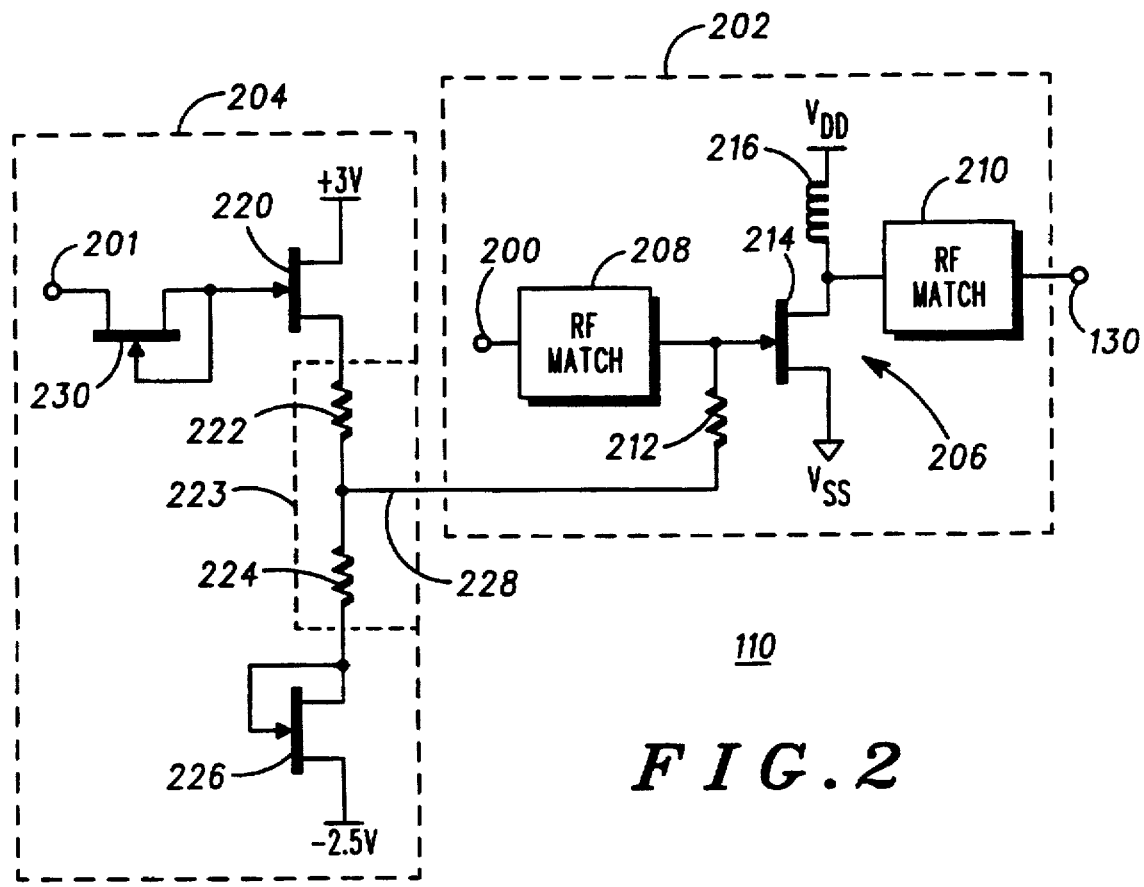
FIG. 2 is a block diagram of a transmitter circuit according to the present invention for use in the communication device of FIG. 1.

FIG. 2 is a block diagram of the transmitter circuit 110 of FIG. 1, according to the present invention. The transmitter circuit 110 includes a radio frequency (RF) power amplifier 202 and a bias circuit 204. The radio frequency power amplifier 202 has an input 200 and the bias circuit 204 has a control input 201.

The radio frequency power amplifier 202 includes a radio frequency gain stage 206, a first RF matching circuit 208, a second RF matching circuit 210 and a gate isolation resistor 212. The output 130 of the radio frequency power amplifier 202 is coupled to the antenna 106 (FIG. 1) for providing RF signals to the antenna 106 at an RF antenna power output level. Specifically, the radio frequency gain stage 206 provides an amplified RF signal to the antenna 106 at the RF antenna power output level.

The radio frequency gain stage 206 includes a depletion mode MESFET (metal epitaxial semiconductor field effect transistor) 214 configured for amplifying an RF signal received at the input 200 for producing the amplified RF signal. The MESFET 214 has a source coupled to a reference potential labelled $V_{SS}$ in FIG. 2. $V_{SS}$ is typically ground potential or 0 Volts.

The MESFET 214 requires biasing by a negative gate-to-source voltage. The MESFET 214 is operated by biasing the MESFET 214 with a gate-to-source voltage ($V_{gs}$) approximating the pinch off or threshold voltage ($V_{th}$) of the MESFET 214. More specifically, the threshold or pinch off voltage ($V_{th}$) of the depletion mode MESFET 214 has a nominal value, for example, −1.2 volts, at room temperature. That is, in order to turn off the MESFET 214, a gate-to-source voltage more negative than −1.2 volts must be applied to the MESFET 214.

The MESFET 214 is characterized by a MESFET temperature coefficient. The MESFET temperature coefficient is typically a negative temperature coefficient; however, due to process parameters of the manufacturing process used to produce the MESFET 214, or due to associated biasing circuitry, such as gate isolation resistor 212 the MESFET temperature coefficient may be positive. Due to the MESFET temperature coefficient, the threshold voltage varies as operating temperature of the MESFET 214 varies. Since the MESFET temperature coefficient is a negative temperature coefficient, the threshold voltage becomes more negative with increasing temperature.

The radio frequency gain stage 206 further includes an RF choke 216 coupled between the drain of MESFET 214 and a reference potential labelled $V_{DD}$ in FIG. 2. The RF choke 216 is typically an inductor for providing a DC bias current to the MESFET 214. $V_{DD}$ is typically in the range of 3 to 5 volts DC. If the radiotelephone handset 104 is a battery powered radiotelephone, $V_{DD}$ corresponds to the battery voltage produced by the battery 136. The first RF matching circuit 208 provides low-loss radio frequency impedance matching between the radio frequency gain stage 206 and circuitry connected to input 200. The second RF matching circuit 210 provides low-loss radio frequency impedance matching between the radio frequency gain stage 206 and circuitry connected to the output 130.

The bias circuit 204 includes a control input 201, a first MESFET 220, a voltage divider 223 including a resistor 222 and a resistor 224, a second MESFET 226, a third MESFET 230 and an output 228. The first MESFET 220 has a drain connected to a positive supply potential, indicated in FIG. 2 as +3 volts. The source of the first MESFET 220 is coupled to a first end of the resistor 222. A second end of the resistor 222 is coupled to a first end of the resistor 224 at the output 228. A second end of the resistor 224 is coupled to the drain and gate of the second MESFET 226. The third MESFET 230 has a source coupled to the control input 201 and a gate and drain coupled together and coupled to the gate of the first MESFET 220. The output 228 is coupled to the gate isolation resistor 212 of the radio frequency power amplifier 202 for providing an output voltage to the radio frequency power amplifier 202.

The first MESFET 220, the second MESFET 226 and the third MESFET 230 are all enhancement mode field effect transistors. That is, they have a threshold voltage $V_{th}$ greater than 0 volts, typically 0.2 volts. To turn on any one of these transistors, a gate-to-source voltage greater than the threshold voltage $V_{th}$ of 0.2 volts must be applied to the transistor.

In accordance with the present invention, the bias circuit 204 receives a positive control voltage at the control input 201 and produces a negative output voltage at the output 228 in response to the positive control voltage. The bias circuit 204 includes a level shifter, voltage divider 223, for receiving the positive control voltage and producing the negative output voltage. The output voltage is suitable for biasing the depletion mode MESFET 214.

The output voltage at the output 228 has a temperature coefficient. In accordance with the present invention, the output voltage temperature coefficient is sufficient to maintain the RF antenna power output level substantially constant. The negative output voltage produced by the bias circuit for biasing the MESFET 214 is temperature compensated to substantially cancel the temperature variation of the radio frequency power amplifier 202 for maintaining the RF antenna power output level at a substantially constant level. Operation of the bias circuit 204 in conjunction with the power amplifier 202 to achieve this result will now be described.

Let the voltage at the control input 201 be represented as $V_g$. $V_g$ is typically a positive control voltage applied to the control input 201. $V_g$ is provided by the controller 112 in the form of an analog voltage provided by the DAC 120. $V_g$ is typically a positive control voltage, having a value in the range between 0 volts and the positive power supply provided by the battery 136 to the radiotelephone handset 104, which is in the range of 3–5 volts. This is the operating range of the circuit forming the radiotelephone handset 104. The processor 118 determines the necessary or desired RF output power level at the antenna 106 and generates a binary or digital value corresponding to this determined RF output power level. The DAC 120 converts the digital value to a corresponding analog voltage and provides the analog voltage to the control input 201. Thus, the controller 112 is coupled to the bias circuit 204 for providing a positive control voltage to the bias circuit 204 for controlling the RF antenna power output level. In response to the analog voltage, the third MESFET 230 acts as a current source. Since there is normally no current into the gate of first MESFET 220, the voltage drop from the source to the drain of the third MESFET 230 is negligible and the voltage at the gate of MESFET 220 is substantially $V_g$.

MESFET 220 is configured as a source follower. The DAC 120 may be able to provide only a limited output current. The source follower input of the bias circuit 204, combined with the presence of third MESFET 230, prevents the bias circuit from loading the output of the DAC 120. The voltage $V_s$ at the source of MESFET 220 is $$V_s = V_g - V_{th220},$$

where $V_{th220}$ is the threshold voltage of the enhancement mode MESFET, MESFET 220.

The gate and drain of the second MESFET 226 are shorted together. Therefore, the voltage at the drain of the second MESFET 226, $V_{d226}$, is $$V_{d226} = -2.5\ V + V_{th226},$$

where $V_{th226}$ is the threshold voltage of the enhancement mode MESFET, MESFET 226.

Resistor 222 and resistor 224 are coupled in series to form the voltage divider 223. The voltage divider 223 establishes a voltage divider ratio $$\frac{R_{224}}{R_{222}+R_{224}}.$$

The voltage at the output 228 is therefore $$V_{out} = \frac{R_{224}}{R_{222}+R_{224}} (V_{s220} - V_{d226}) + V_{d226},$$

where $R_{222}$ is the resistance value, in ohms, of resistor 222 and where $R_{224}$ is the resistance value, in ohms, of resistor 224. $V_{out}$ is a bias voltage for biasing the MESFET 214.

Substituting for $V_{s220}$ and for $V_{d226}$ from above, $$V_{out} =$$

$$\left(\frac{R_{224}}{R_{222}+R_{224}}\right)((V_g - V_{th220}) - (-2.5V + V_{th226})) + (-2.5 + V_{th226})$$

If first MESFET 220 and second MESFET 226 are substantially identical devices and conduct substantially the same current, then $V_{th220}=V_{th226}$ and $$V_{out} = \text{Const} + V_{th220}\left(1 - 2\left(\frac{R_{224}}{R_{222}+R_{224}}\right)\right)$$

where $$\text{Const} = \left(\frac{R_{224}}{R_{222}+R_{224}}\right)(V_g - (-2.5)) + (-2.5)$$

Thus, the bias circuit 204 permits control of the bias voltage provided to the radio frequency power amplifier 202 and the temperature coefficient of this bias voltage. The bias voltage, which is the voltage at the output 228, may be varied by the controller 112 by varying the control voltage $V_g$ provided to the control input 201. By varying $V_g$, the controller can vary the RF power output level at the antenna 106. By choosing the voltage divider ratio $$\frac{R_{224}}{R_{222}+R_{224}},$$

the temperature coefficient of the bias voltage may be fine tuned to compensate the temperature variation of the MESFET 214 of the radio frequency gain stage 206. By combining these two, the RF power output at the antenna 106 may be maintained within tightly controlled limits over temperature.

Moreover, by adjusting the voltage divider ratio $$\frac{R_{224}}{R_{222}+R_{224}},$$

a positive or negative temperature coefficient is realized for the bias voltage at the output 228. For example, for $$\frac{R_{224}}{R_{222}+R_{224}} < 0.5,$$

a positive temperature coefficient is realized. Similarly, for $$\frac{R_{224}}{R_{222}+R_{224}} > 0.5,$$

a negative temperature coefficient is realized. Thus, the voltage divider is adjustable to provide one of a positive output voltage temperature coefficient and a negative output voltage temperature coefficient for compensating the MESFET temperature coefficient. If the MESFET 214 has a negative temperature coefficient, the voltage divider establishes the voltage divider ratio to provide a negative output voltage temperature coefficient which temperature coefficient compensates the negative temperature coefficient. Moreover, the voltage divider is adjustable to provide a range of positive output voltage temperature coefficients and to provide a range of negative output voltage temperature coefficients, by adjusting the individual values of $R_{222}$ and $R_{224}$. By temperature compensating the output voltage or bias voltage at the output 228 to track with the temperature variation of the MESFET 214, the bias circuit 204 maintains the RF antenna power output level at a substantially constant value over temperature.

As can be seen from the foregoing, the present invention provides a communication device including a RF power amplifier and a bias circuit suitable for operation in the 1800–2000 MHz frequency range. The power amplifier includes a depletion mode MESFET which provides good performance at such a frequency range. To properly bias the MESFET in a circuit including logic components powered by a conventional 3–5 volt battery, the bias circuit includes a level shifter to provide the necessary gate-to-source voltage for the MESFET. To maintain the RF output power from the communication device constant over temperature, the bias circuit output voltage varies over temperature to track the temperature variation of the MESFET.

While a particular embodiment of the present invention has been shown and described, modifications may be made. For example, in the bias circuit 204, MESFET 226 may be replaced with a silicon or gallium arsenide diode or with a silicon NPN transistor with base and collector shorted. It is therefore intended in the appended claims to cover all such changes and modifications which fall within the true spirit and scope of the invention.

What is claimed is:

1. A radio frequency (RF) power amplifier, comprising:

a radio frequency gain stage for providing an amplified RF signal to an antenna at an RF antenna power output level, the radio frequency gain stage including a depletion mode MESFET (metal epitaxial semiconductor field effect transistor) configured for amplifying an RF signal to provide the amplified RF signal, the depletion mode MESFET being characterized by a MESFET temperature coefficient; and a bias circuit having a control input for receiving a variable control signal and an output coupled to the radio frequency gain stage, the bias circuit providing an output voltage to the radio frequency gain stage in response to the variable control signal, the output voltage having an output voltage temperature coefficient, the output voltage temperature coefficient substantially compensating the MESFET temperature coefficient to maintain the RF antenna power output level substantially constant.

2. A radio frequency power amplifier as recited in claim 1 wherein the bias circuit includes a voltage divider for producing the output voltage in response to the variable control signal, the voltage divider being adjustable to provide one of a positive output voltage temperature coefficient and a negative output voltage temperature coefficient for compensating the MESFET temperature coefficient.

3. A radio frequency power amplifier as recited in claim 2 wherein the voltage divider is adjustable to provide a range of positive output voltage temperature coefficients and to provide a range of negative output voltage temperature coefficients.

4. A radio frequency (RF) power amplifier, comprising:

a radio frequency gain stage for providing an amplified RF signal to an antenna at an RF antenna power output level, the radio frequency gain stage including a depletion mode MESFET (metal epitaxial semiconductor field effect transistor) configured for amplifying an RF signal to provide the amplified RF signal and characterized by a MESFET temperature coefficient; and a bias circuit having a control input for receiving a variable control signal and an output coupled to the radio frequency gain stage, the bias circuit providing an output voltage to the radio frequency gain stage in response to the variable control signal, the output voltage having an output voltage temperature coefficient sufficient to maintain the RF antenna power output level substantially constant;

wherein the output voltage temperature coefficient substantially compensates the MESFET temperature coefficient and wherein the depletion mode MESFET requires biasing by a negative gate-to-source voltage and the variable control signal comprises a positive voltage, and wherein the bias circuit includes a level shifter for receiving the positive voltage and producing the output voltage suitable for biasing the depletion mode MESFET.

5. A communication device, comprising:

an antenna;

a radio frequency (RF) power amplifier coupled to the antenna for providing amplified RF signals to the antenna at an RF antenna power output level, the RF power amplifier having a temperature variation;

a bias circuit coupled to the RF power amplifier, the bias circuit having a control input for receiving a positive control voltage and an output coupled to the RF power amplifier, the bias circuit producing a negative output voltage in response to the positive control voltage, the negative output voltage being temperature compensated to substantially cancel the temperature variation of the RF power amplifier for maintaining the RF antenna power output level at a substantially constant value; and a controller coupled to the bias circuit for providing the positive control voltage to the bias circuit for controlling the RF antenna power output level.

6. A communication device as recited in claim 5 wherein the bias circuit includes a voltage divider for establishing a voltage divider ratio, the voltage divider ratio being variable for temperature compensating the negative output voltage.

7. A communication device as recited in claim 6 wherein the RF power amplifier includes a depletion mode MESFET (metal epitaxial semiconductor field effect transistor) for producing the amplified RF signals, the depletion mode MESFET having a negative temperature coefficient, the voltage divider establishing the voltage divider ratio to provide a negative output voltage temperature coefficient which temperature compensates the negative temperature coefficient.

* * * * *